US012761678B2

(12) United States Patent
Kuo

(10) Patent No.: US 12,761,678 B2
(45) Date of Patent: Oct. 13, 2026

(54) VOLTAGE COMPARISON CIRCUIT AND CURRENT DETECTION SYSTEM

(71) Applicant: Quanta Computer Inc., Taoyuan City (TW)

(72) Inventor: Hsin-Chih Kuo, Taoyuan City (TW)

(73) Assignee: QUANTA COMPUTER INC., Taoyuan City (TW)

( * ) Notice: Subject to any disclaimer, the term of this patent is extended or adjusted under 35 U.S.C. 154(b) by 129 days.

(21) Appl. No.: 18/952,267

(22) Filed: Nov. 19, 2024

(65) Prior Publication Data

US 2026/0050279 A1 Feb. 19, 2026

(30) Foreign Application Priority Data

Aug. 16, 2024 (TW) ................................ 113130859

(51) Int. Cl.
*G05F 1/571* (2006.01)
*G01R 19/165* (2006.01)

(52) U.S. Cl.
CPC ....... *G05F 1/571* (2013.01); *G01R 19/16576* (2013.01)

(58) Field of Classification Search
CPC ...... G05F 1/571; G05F 1/56; G01R 19/16576
See application file for complete search history.

(56) References Cited

U.S. PATENT DOCUMENTS

| | | | | |
|---|---|---|---|---|
| 2020/0375001 | A1* | 11/2020 | Jung | H05B 45/375 |
| 2021/0067149 | A1* | 3/2021 | Yasusaka | H03K 5/2472 |
| 2023/0353134 | A1 | 11/2023 | Yasusaka | |
| 2024/0310416 | A1* | 9/2024 | Ichikawa | G01R 19/0038 |

FOREIGN PATENT DOCUMENTS

| | | | | |
|---|---|---|---|---|
| CN | 101394165 | B | * | 5/2011 |
| JP | 2011097396 | A | * | 5/2011 |

OTHER PUBLICATIONS

Chinese language office action dated Apr. 17, 2025, issued in application No. TW 113130859.

* cited by examiner

*Primary Examiner* — Sisay G Tiku

(74) *Attorney, Agent, or Firm* — McClure, Qualey & Rodack, LLP

(57) ABSTRACT

A voltage comparison circuit is provided. The voltage comparison circuit includes a voltage comparator, a voltage control circuit, and a reference voltage variable circuit. The voltage comparator compares an input voltage and a reference voltage, and outputs a first output voltage corresponding to the comparison result. The voltage control circuit receives the first output voltage and generates a second output voltage. The reference voltage variable circuit receives the second output voltage, and outputs the corresponding reference voltage to the voltage comparator. When the input voltage is greater or equal to the reference voltage, the first output voltage becomes zero, the second output voltage becomes a supply voltage, and the reference voltage becomes the maximum reference voltage. When the input voltage is smaller than the reference voltage, the first output voltage becomes the supply voltage, the second output voltage becomes zero, and the reference voltage becomes the minimum reference voltage.

10 Claims, 5 Drawing Sheets

VOLTAGE COMPARISON CIRCUIT AND CURRENT DETECTION SYSTEM

CROSS REFERENCE TO RELATED APPLICATIONS

This application claims priority of Taiwan Patent Application No. 113130859, filed on Aug. 16, 2024, the entirety of which is incorporated by reference herein.

BACKGROUND OF THE INVENTION

Field of the Invention

The present invention relates to a voltage comparison circuit, specifically to a voltage comparison circuit that can automatically adjust the output voltage, as well as a current detection system using the voltage comparison circuit.

Description of the Related Art

Typically, circuit systems are equipped with microcontrollers for detecting system current levels, which indicate the system to reduce performance when current levels are too high to prevent damage, and to increase performance when current levels are too low. However, since current changes in the system are not fixed, setting the microcontroller close to the detection point may result in frequent changes to the system performance, potentially compromising other functions of the microcontroller and affecting other operations of the system. Therefore, a new solution is needed to address these issues.

BRIEF SUMMARY OF THE INVENTION

An embodiment of the present invention provides a voltage comparison circuit, which includes a voltage comparator, a voltage control circuit, and a reference voltage variable circuit. The voltage comparator is configured to compare an input voltage with a reference voltage and outputs a first output voltage corresponding to its comparison result. The voltage control circuit is configured to receive the first output voltage and generate a second output voltage. The reference voltage variable circuit is configured to receive the second output voltage and output the reference voltage to the voltage comparator correspondingly. When the input voltage is greater than or equal to the reference voltage, the first output voltage becomes zero, the second output voltage becomes equal to a supply voltage, and the reference voltage becomes equal to a reference voltage lower limit. Conversely, when the input voltage is less than the reference voltage, the first output voltage becomes equal to the supply voltage, the second output voltage becomes zero, and the reference voltage becomes equal to a reference voltage upper limit.

An embodiment of the present invention further provides a current detection system, which includes the voltage comparison circuit, a detection resistor, a current detection circuit, a first system circuit, and a second system circuit. The current detection circuit is configured to detect an input current flowing through the detection resistor and convert this input current into the input voltage to output to the voltage comparison circuit. The first system circuit is configured to receive the first output voltage, while the second system circuit is configured to receive the second output voltage. When the first output voltage is equal to zero and the second output voltage is equal to the supply voltage, both the first and second system circuits perform down-frequency operations, resulting in a decrease in the input current. Conversely, when the first output voltage is equal to the supply voltage and the second output voltage is equal to zero, both the first and second system circuits perform up-frequency operations, resulting in an increase in the input current.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is made for the purpose of illustrating the general principles of the invention and should not be taken in a limiting sense. The scope of the invention is best determined by reference to the appended claims.

This section refers to the accompanying illustrations describing multiple embodiments, in which similar reference numbers are used to indicate similar or equivalent components. The illustrations are not necessarily drawn to scale and are for illustrative purposes only to explain the aspects and features of the disclosure. A substantial amount of specific details, relationships, and methods are presented to provide a comprehensive understanding of the specific aspects and features of the disclosure. However, those skilled in the relevant technical field will appreciate that these aspects and features can be practiced in the absence of one or more of the specific details mentioned, or in other relationships, or using alternative methods. In some instances, well-known structures or operations are not described in detail for illustrative purposes. The multiple embodiments disclosed here are not necessarily limited to the order of actions or events depicted; some actions may occur in a different order and/or simultaneously with other actions or events. Furthermore, not all actions illustrated are essential to practicing the specific aspects and features of the disclosure.

Figure 1:
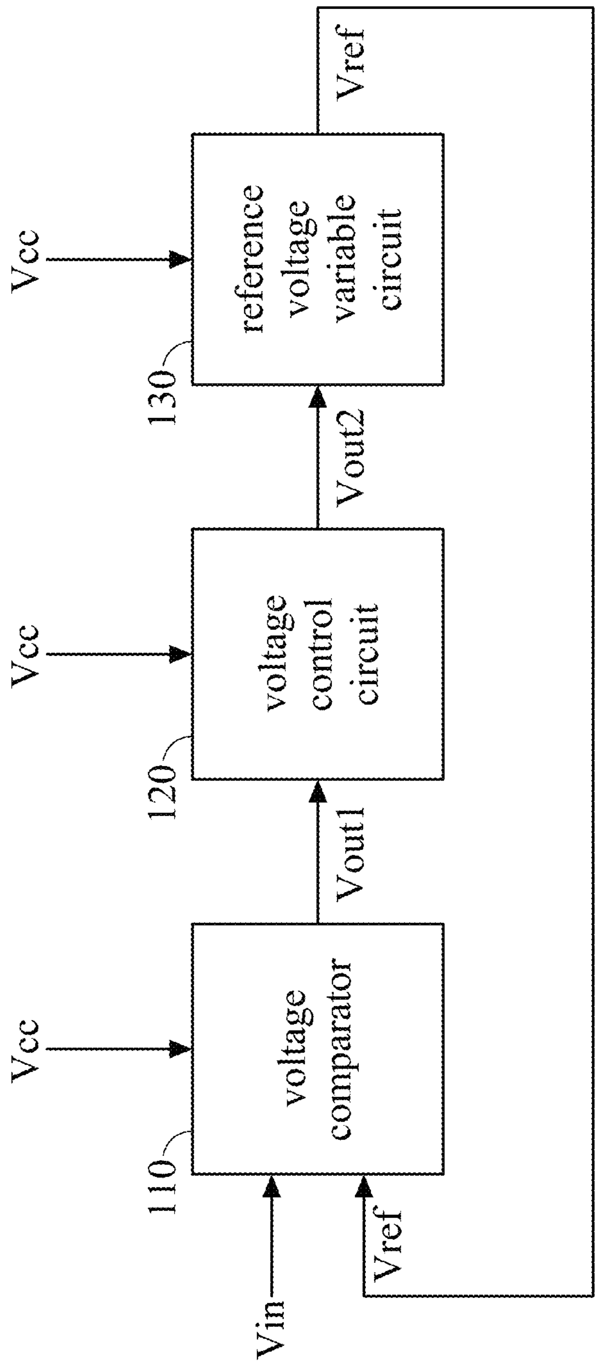
FIG. 1 shows a block diagram of a voltage comparison circuit described in the disclosed embodiment.

FIG. 1 is a block diagram of a voltage comparison circuit 100 described in an embodiment of this disclosure. As shown in FIG. 1, the voltage comparison circuit 100 includes a voltage comparator 110, a voltage control circuit 120, and a reference voltage variable circuit 130. A supply voltage Vcc is configured to serve as power source of the voltage comparator 110, the voltage control circuit 120, and the reference voltage variable circuit 130. The voltage comparator 110 is configured to receive an input voltage Vin and a reference voltage Vref, and outputs an output voltage Vout1. Specifically, when the input voltage Vin is greater than or equal to the reference voltage Vref, the output voltage Vout1 is zero. Conversely, when the input voltage Vin is less than the reference voltage Vref, the output voltage Vout1 is the supply voltage Vcc.

The voltage control circuit 120 is configured to be coupled to the voltage comparator 110 to receive the output voltage Vout1 and output an output voltage Vout2. The reference voltage variable circuit 130 is configured to be coupled to the voltage control circuit 120 to receive the output voltage Vout2 and output the reference voltage Vref. At this point, the reference voltage Vref is output to the voltage comparator 110, which will then compare the input voltage Vin and the reference voltage Vref in the next iteration, thereby achieving automatic voltage regulation. The detailed operation of the voltage comparison circuit 100 will be described in reference to FIGS. 3 and 4 below.

Figure 2:
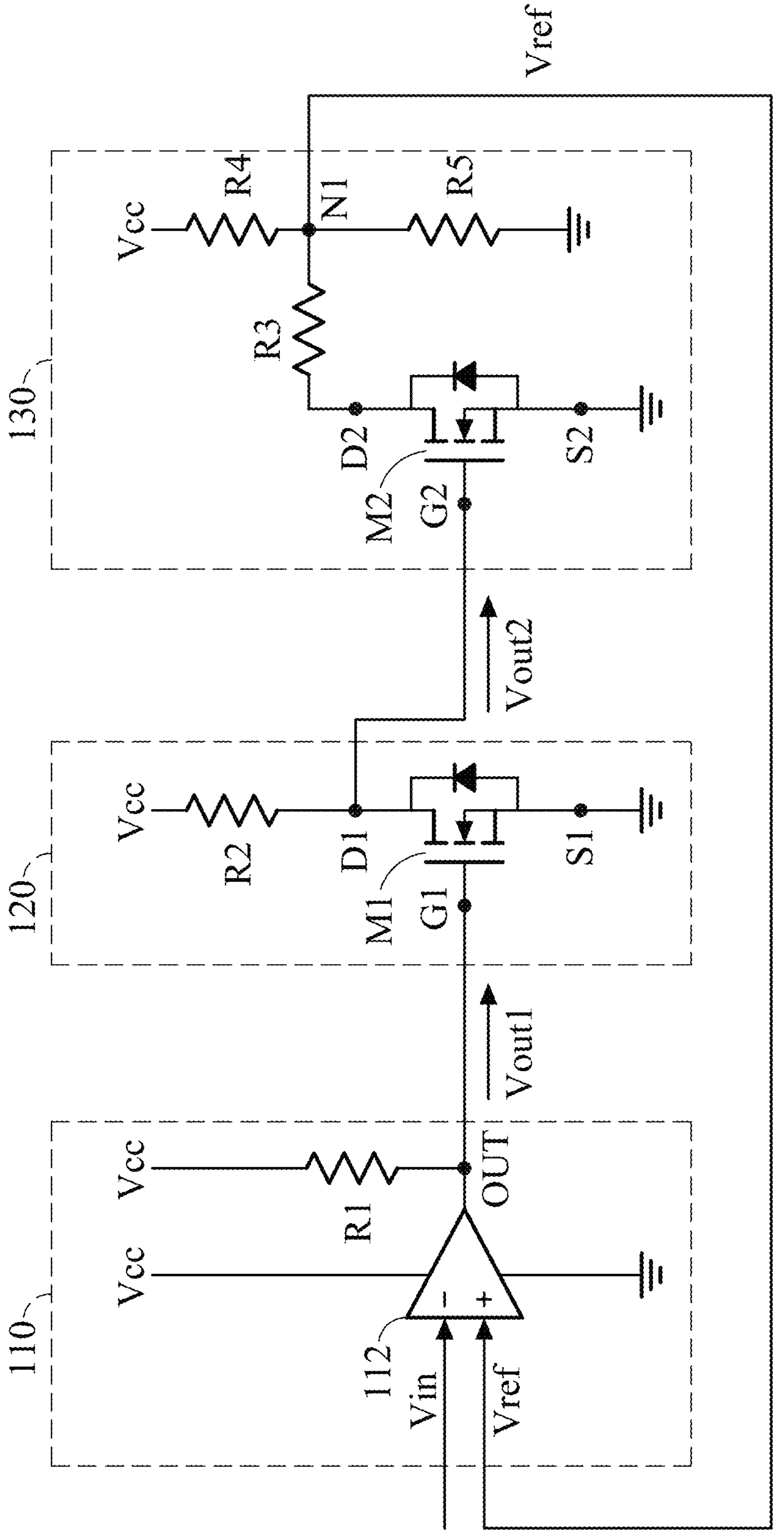
FIG. 2 shows a circuit diagram of an example of the voltage comparison circuit described in the disclosed embodiment.

FIG. 2 is a circuit diagram of an example of the voltage comparison circuit 100 described in an embodiment of this disclosure. As shown in FIG. 2, the voltage comparator 110 includes a comparator 112 and a resistor R1. The comparator 112 has a negative input (marked as "–"), a positive input (marked as "+"), and an output terminal OUT. The negative input is configured to receive the input voltage Vin, while the positive input is configured to receive the reference voltage Vref, and the output terminal OUT outputs the output voltage Vout1. One end of the resistor R1 is coupled to the supply voltage Vcc, and the other end is coupled to the output terminal OUT. Therefore, when the input voltage Vin is greater than or equal to the reference voltage Vref, the output terminal OUT of the comparator 112 is connected to ground, causing the output voltage Vout1 to zero. Conversely, when the input voltage Vin is less than the reference voltage Vref, the output terminal OUT of the comparator 112 is connected to the supply voltage Vcc through the resistor R1, resulting in the output voltage Vout1 equaling the supply voltage Vcc.

As shown in FIG. 2, the voltage control circuit 120 includes a transistor M1 and a resistor R2, wherein the transistor M1 can be an N-type metal-oxide semiconductor transistor (NMOS). The gate terminal G1 of the transistor M1 is coupled to the output terminal OUT of the comparator 112 to receive the output voltage Vout1. The drain terminal D1 of the transistor M1 is configured to output the output voltage Vout2 to the reference voltage variable circuit 130, while the source terminal S1 of the transistor M1 is coupled to ground. The resistor R2 is coupled to the supply voltage Vcc on one end and to the drain terminal D1 of the transistor M1 on the other end. When the output voltage Vout1 is zero, the transistor M1 is turned off, so the drain terminal D1 of the transistor M1 is coupled to the supply voltage Vcc through the resistor R2, resulting in the output voltage Vout2 being equal to the supply voltage Vcc. Conversely, when the output voltage Vout1 is equal to the supply voltage Vcc, the transistor M1 is turned on, causing the drain terminal D1 to couple to ground through the transistor M1, thereby making the output voltage Vout2 to zero.

As shown in FIG. 2, the reference voltage variable circuit 130 includes a transistor M2 and resistors R3, R4, and R5, wherein the transistor M2 can be an NMOS. The gate terminal G2 of the transistor M2 is coupled to the drain terminal D1 of the transistor M1 to receive the output voltage Vout2. The drain terminal D2 of the transistor M2 is coupled to one end of the resistor R3, while the source terminal S2 of the transistor M2 is coupled to ground. The other end of the resistor R3 is coupled to a node N1. One end of the resistor R4 is coupled to the supply voltage Vcc, and the other end of the resistor R4 is connected to node N1. One end of the resistor R5 is coupled to node N1, and the other end of the resistor R5 is coupled to ground.

When the output voltage Vout2 is zero, the transistor M2 is turned off, and the resistors R4 and R5 form a voltage divider from the supply voltage Vcc to generate the reference voltage Vref. At this time, the reference voltage Vref is the maximum input voltage Vin_H (i.e., the upper limit of the reference voltage), as described by the following equation:

$$Vref = Vcc \times \frac{R5}{R4 + R5} = \text{Vin\_H}$$

When the output voltage Vout2 is equal to the supply voltage Vcc, the transistor M2 is turned on, and one end of the resistor R3 is coupled to ground through the transistor M2. Thus, the resistors R3, R4, and R5 form a voltage divider from the supply voltage Vcc to generate the reference voltage Vref. At this time, the reference voltage Vref is the minimum input voltage Vin_L (i.e., the lower limit of the reference voltage), as described by the following equation:

$$Vref = Vcc \times \frac{R3 \| R5}{R4 + R3 \| R5} = \text{Vin\_L}$$

Figure 3:
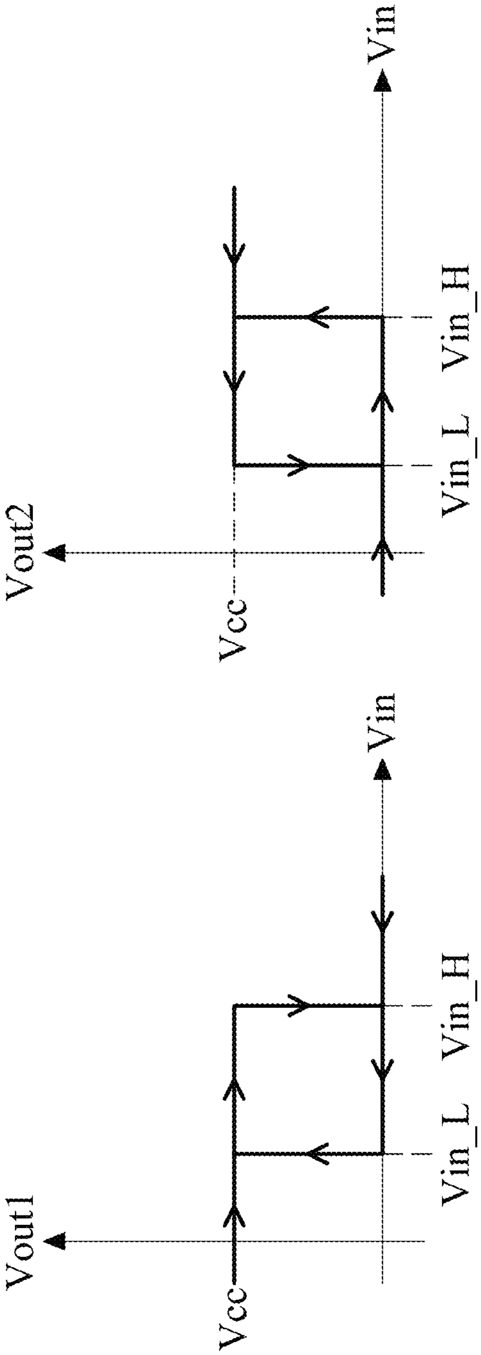
FIG. 3 shows a hysteresis curve diagram described in the disclosed embodiment.

FIG. 3 is a hysteresis curve diagram 200 according to an embodiment described in this disclosure. For the output voltage Vout1, in one embodiment, if the input voltage Vin is greater than or equal to the maximum input voltage Vin_H in the initial state, then the output voltage Vout1 is zero. It is not until the input voltage Vin drops to the minimum input voltage Vin_L that the output voltage Vout1 changes from zero to the supply voltage Vcc. Subsequently, if the input voltage Vin continues to decrease, the output voltage Vout1 remains at the supply voltage Vcc. Conversely, if the input voltage Vin rises, the output voltage Vout1 will change from the supply voltage Vcc to zero until the input voltage Vin rises to the maximum input voltage Vin_H. In another embodiment, if the input voltage Vin is less than the minimum input voltage Vin_L in the initial state, then the output voltage Vout1 is equal to the supply voltage Vcc. It is not until the input voltage Vin rises to the maximum input voltage Vin_H that the output voltage Vout1 changes from the supply voltage Vcc to zero. Subsequently, if the input voltage Vin continues to increase, the output voltage Vout1 remains at zero. Conversely, if the input voltage Vin decreases, the output voltage Vout1 will change from zero to the supply voltage Vcc until the input voltage Vin drops to the minimum input voltage Vin_L.

Continuing with reference to FIG. 3, for the output voltage Vout2, in one embodiment, if the input voltage Vin is greater than or equal to the maximum input voltage Vin_H in the initial state, then the output voltage Vout2 is equal to the supply voltage Vcc. It is not until the input voltage Vin drops to the minimum input voltage Vin_L that the output voltage Vout2 changes from the supply voltage Vcc to zero. Subsequently, if the input voltage Vin continues to decrease, the output voltage Vout2 remains at zero. Conversely, if the input voltage Vin rises, the output voltage Vout2 will change from zero to the supply voltage Vcc until the input voltage Vin increases to the maximum input voltage Vin_H. In another embodiment, if the input voltage Vin is less than the minimum input voltage Vin_L in the initial state, then the output voltage Vout2 is zero. It is not until the input voltage Vin rises to the maximum input voltage Vin_H that the output voltage Vout2 changes from zero to the supply voltage Vcc. Subsequently, if the input voltage Vin continues to increase, the output voltage Vout2 remains at the supply voltage Vcc. Conversely, if the input voltage Vin decreases, the output voltage Vout2 will change from the supply voltage Vcc to zero until the input voltage Vin drops to the minimum input voltage Vin_L.

Figure 4:
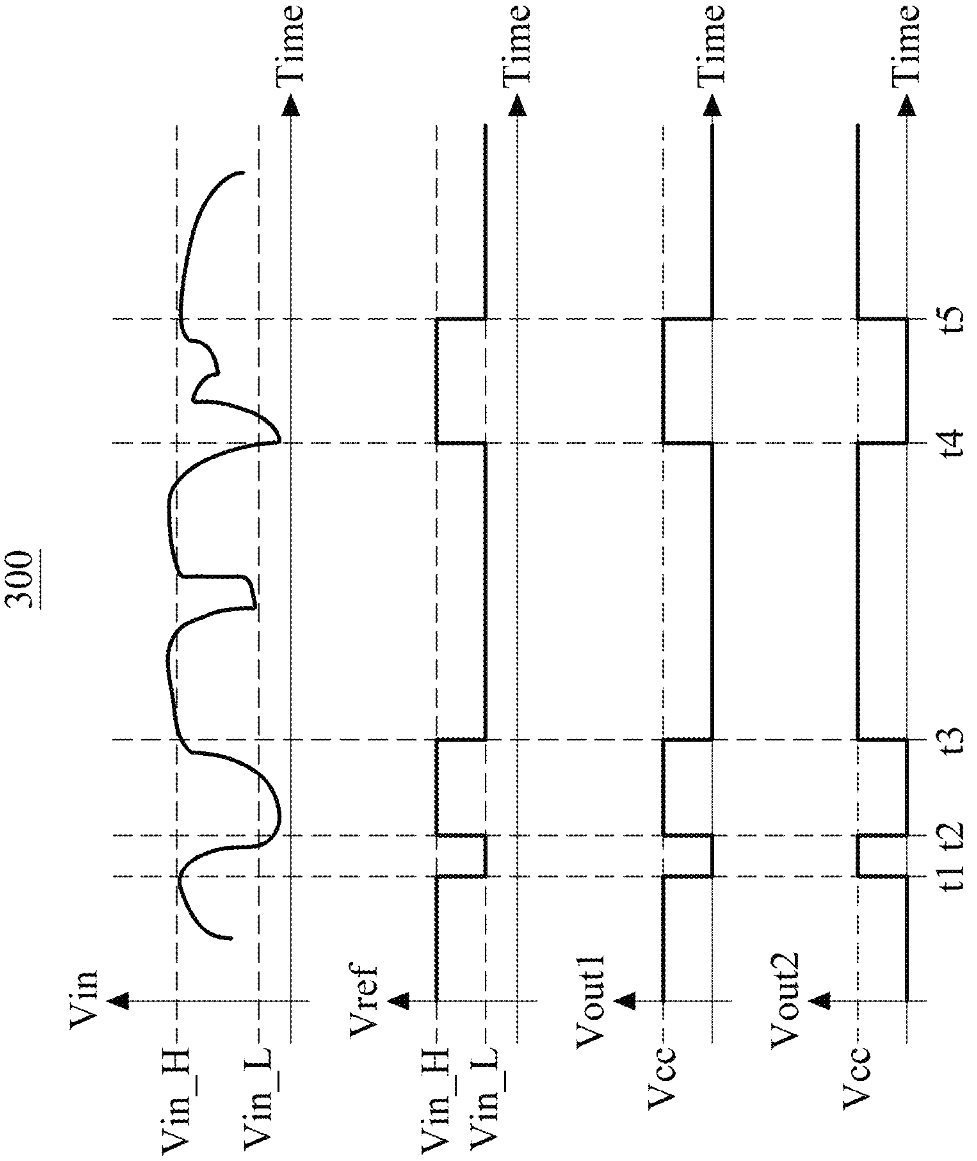
FIG. 4 shows a timing diagram of complex voltages described in the disclosed embodiment.

FIG. 4 is a timing diagram 300 for multiple voltages based on the embodiments described in this disclosure. Utilizing the characteristics presented in the hysteresis curve diagram 200, the detailed operation of the voltage comparison circuit 100 is illustrated alongside the voltage changes shown in the timing diagram 300. As shown in FIG. 4, before time t1, the input voltage Vin is greater than the minimum input voltage Vin_L but less than the maximum input voltage Vin_H, and the reference voltage Vref is equal to the supply voltage Vcc. At this time, the input voltage Vin is less than the reference voltage Vref, causing the output voltage Vout1 to equal the supply voltage Vcc. The transistor M1 is turned on, resulting in the output voltage Vout2 being zero.

Then at time t1, the input voltage Vin rises to greater than or equal to the maximum input voltage Vin_H, and the reference voltage Vref is equal to the maximum input voltage Vin_H. At this time, the input voltage Vin is greater than or equal to the reference voltage Vref, causing the output voltage Vout1 to change from the supply voltage Vcc to zero, the transistor M1 is turned off, resulting in the output voltage Vout2 changing from zero to the supply voltage Vcc, and the transistor M2 is turned on. At this moment, the reference voltage Vref is equal to the minimum input voltage Vin_L generated by the voltage divider formed by resistors R3, R4, and R5 from the supply voltage Vcc.

At times t2 and t4, the input voltage Vin decreases from greater than or equal to the maximum input voltage Vin_H to less than the minimum input voltage Vin_L, and the reference voltage Vref is equal to the minimum input voltage Vin_L. At this time, the input voltage Vin is less than the reference voltage Vref (i.e., the condition of "dropping to the minimum input voltage Vin_L" has been satisfied), causing the output voltage Vout1 to change from zero to the supply voltage Vcc, the transistor M1 is turned on, resulting in the output voltage Vout2 changing from the supply voltage Vcc to zero, and the transistor M2 is turned off. At this moment, the reference voltage Vref is equal to the maximum input voltage Vin_H generated by the voltage divider formed by resistors R4 and R5 from the supply voltage Vcc.

At times t3 and t5, the input voltage Vin rises to greater than or equal to the maximum input voltage Vin_H, and the reference voltage Vref is equal to the maximum input voltage Vin_H. At this moment, the input voltage Vin is greater than or equal to the reference voltage Vref (i.e., the condition of "rising to the maximum input voltage Vin_H" has been satisfied), causing the output voltage Vout1 to change from the supply voltage Vcc to zero, the transistor M1 is turned off, resulting in the output voltage Vout2 changing from zero to the supply voltage Vcc, and the transistor M2 is turned on. At this moment, the reference voltage Vref is equal to the minimum input voltage Vin_L generated by the voltage divider formed by resistors R3, R4, and R5 from the supply voltage Vcc.

It should be noted that during the interval from time t3 to t4, the input voltage Vin switches multiple times between being greater than or equal to the maximum input voltage Vin_H and being less than Vin_H but greater than the minimum input voltage Vin_L. However, because the voltage comparison circuit 100 has the characteristics of hysteresis curve diagram 200, when the input voltage Vin changes from Vin≥Vin_H to Vin_H>Vin>Vin_L, the reference voltage Vref and the output voltages Vout1 and Vout2 do not change. Additionally, when the input voltage Vin transitions from Vin_H>Vin>Vin_L back to Vin≥Vin_H, the reference voltage Vref will remain unchanged. Furthermore, since the input voltage Vin has not dropped below the minimum input voltage Vin_L, there will be no voltage change in the output voltages Vout1 and Vout2 either.

Figure 5:
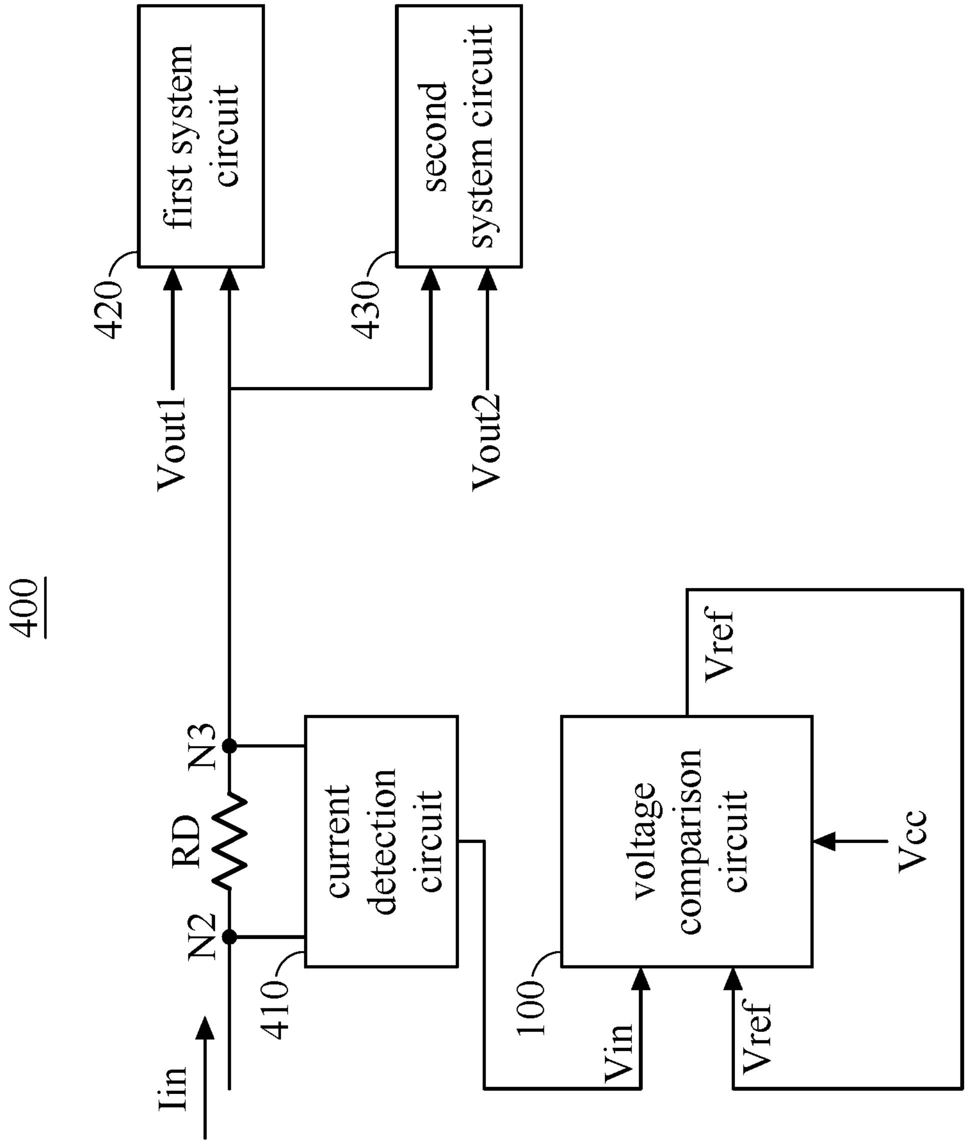
FIG. 5 shows a block diagram of a current detection system described in the disclosed embodiment.

FIG. 5 is a block diagram of a current detection system 400 based on the embodiments described in this disclosure. The current detection system 400 includes a current detection circuit 410, a detection resistor RD, a voltage comparison circuit 100, a first system circuit 420, and a second system circuit 430. The current detection system 400 receives an input current Iin to provide it to the functional blocks of the first system circuit 420 and the second system circuit 430. The current detection circuit 410 measures the input current Iin passing through nodes N2 and N3 via the detection resistor RD, converts it into a corresponding detection voltage VD, amplifies the corresponding detection voltage VD by a gain Av, and then generates an input voltage Vin to output to the voltage comparison circuit 100.

Then, the voltage comparison circuit 100 generates output voltages Vout1 and Vout2, as well as a new reference voltage Vref, based on the currently received input voltage Vin and a preset reference voltage Vref (i.e., the reference voltage Vref when the input voltage Vin is nonexistent or zero). The output voltages Vout1 and Vout2 are respectively output to the first system circuit 420 and the second system circuit 430 for controlling the down-frequency and/or up-frequency of the first system circuit 420 and the second system circuit 430.

For example, when the input current Iin is greater than or equal to 9 A, the first system circuit 420 and the second system circuit 430 need to perform down-frequency. Conversely, when the input current Iin is less than 4 A, the first system circuit 420 and the second system circuit 430 need to perform up-frequency. In certain embodiments, the relationship between the input voltage Vin and the input current Iin is given by Vin=Iin×0.2. Thus, when the input current Iin is 9 A, the input voltage Vin will be 1.8V, and when the input current Iin is 4 A, the input voltage Vin will be 0.8V. At this point, by adjusting the resistance values of the supply voltage Vcc and resistors R3, R4 and R5, the preset reference voltage Vref (i.e. the maximum input voltage Vin_H) corresponding to the maximum frequency modulation value of the input current Iin (the current value is 9 A, corresponding voltage 1.8) can be obtained, and the minimum input voltage Vin_L corresponding to the minimum frequency modulation value of the input current Iin (the current value is 4 A, corresponding voltage 0.8).

When the input current Iin exceeds 9 A, the input voltage Vin will rise to greater than or equal to 1.8V (i.e., greater than or equal to the reference voltage Vref of the maximum input voltage Vin_H). At this point, the output voltage Vout1 will be zero, and the output voltage Vout2 will equal the supply voltage Vcc. The output voltages Vout1 and Vout2 are then respectively sent to the first system circuit 420 and the second system circuit 430 for down-frequency and/or up-frequency. By configuring the first system circuit 420 to perform down-frequency when the output voltage Vout1 is zero and the second system circuit 430 to perform down-frequency when the output voltage Vout2 is equal to the supply voltage Vcc. Both the first system circuit 420 and the second system circuit 430 can perform down-frequency simultaneously when the input current Iin is greater than 9 A, achieving the effect of reducing the input current Iin.

Conversely, when the input current Iin is less than 4 A, the input voltage Vin will drop to less than 0.8V (i.e., less than the reference voltage Vref corresponding to the minimum input voltage Vin_L). At this point, the output voltage Vout1 will equal the supply voltage Vcc, while the output voltage Vout2 will be zero. Since the first system circuit 420 is configured to perform down-frequency when the output voltage Vout1 is zero, and the second system circuit 430 is configured to perform down-frequency when the output voltage Vout2 is equal to the supply voltage Vcc. Both the first system circuit 420 and the second system circuit 430 can perform up-frequency simultaneously (i.e., return to the performance prior to down-frequency) when the output voltage Vout1 is equal to the supply voltage Vcc and the output voltage Vout2 is zero, thus achieving the effect of increasing the input current Iin.

The voltage comparison circuit 100 provided by this disclosure can automatically adjust the output voltages Vout1 and Vout2, as well as the magnitude of the next reference voltage Vref, based on the current input voltage Vin and the reference voltage Vref. If the current input voltage Vin is greater than or equal to the current reference voltage Vref, then the output voltage Vout1 will be zero, the output voltage Vout2 will equal the supply voltage Vcc, and the next reference voltage Vref will equal the minimum input voltage Vin_L (i.e., the lower limit of the reference voltage). Conversely, if the current input voltage Vin is less than the current reference voltage Vref, then the output voltage Vout1 will equal the supply voltage Vcc, the output voltage Vout2 will be zero, and the next reference voltage Vref will equal the maximum input voltage Vin_H (i.e., the upper limit of the reference voltage).

This disclosure also provides a current detection system that includes a voltage comparison circuit 100, a current detection circuit, a detection resistor, and a system circuit. The current detection circuit obtains the detection voltage VD through the detection resistor and multiplies it by a gain Av to generate the input voltage Vin, which is then output to the voltage comparison circuit 100. Subsequently, after performing the operations described in this disclosure, the voltage comparison circuit 100 produces output voltages Vout1 and Vout2, which are then respectively output to different system circuits. This allows the system circuits to perform down-frequency and/or up-frequency operations, achieving the goal of automatically adjusting the input current Iin without the need for additional microcontroller settings for control.

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A voltage comparison circuit, comprising:

a voltage comparator, configured to compare an input voltage with a reference voltage to generate a comparison result and output a first output voltage corresponding to the comparison result;

a voltage control circuit, configured to receive the first output voltage and generate a second output voltage; and a reference voltage variable circuit, configured to receive the second output voltage and output the reference voltage to the voltage comparator;

wherein, when the input voltage is greater than or equal to the reference voltage, the first output voltage becomes zero, the second output voltage becomes a supply voltage, and the reference voltage becomes a reference voltage lower limit;

wherein, when the input voltage is less than the reference voltage, the first output voltage becomes the supply voltage, the second output voltage becomes zero, and the reference voltage becomes a reference voltage upper limit.

2. The voltage comparison circuit as claimed in claim 1, wherein the voltage comparator comprises:

a comparator, having a negative input, a positive input, and an output, wherein the negative input is configured to receive the input voltage, the positive input is configured to receive the reference voltage, and the output is configured to output the first output voltage; and a first resistor, having a first terminal and a second terminal, wherein the first terminal is configured to be coupled to the supply voltage and the second terminal is configured to be coupled to the output.

3. The voltage comparison circuit as claimed in claim 2, wherein the voltage control circuit comprises:

a first transistor, having a first gate terminal, a first drain terminal, and a first source terminal, wherein the first gate terminal is coupled to the output of the comparator, the first drain terminal is configured to output the second output voltage, and the first source terminal is coupled to ground; and a second resistor, having a third terminal and a fourth terminal, wherein the third terminal is coupled to the supply voltage and the fourth terminal is coupled to the first drain terminal.

4. The voltage comparison circuit as claimed in claim 3, wherein the reference voltage variable circuit comprises:

a second transistor, having a second gate terminal, a second drain terminal, and a second source terminal, wherein the second gate terminal is coupled to the first drain terminal of the first transistor, and the second source terminal is coupled to ground;

a third resistor, having a fifth terminal and a sixth terminal, wherein the fifth terminal is coupled to the second drain terminal of the second transistor, and the sixth terminal is coupled to a first node;

a fourth resistor, having a seventh terminal and an eighth terminal, wherein the seventh terminal is coupled to the supply voltage, and the eighth terminal is coupled to the first node; and a fifth resistor, having a ninth terminal and a tenth terminal, wherein the ninth terminal is coupled to the first node, and the tenth terminal is coupled to ground, wherein the reference voltage variable circuit outputs the reference voltage from the first node.

5. The voltage comparison circuit as claimed in claim 1, wherein:

when the input voltage is greater than or equal to the reference voltage upper limit, in response to the input voltage dropping to the reference voltage lower limit, the first output voltage changes from zero to the supply voltage, and the second output voltage changes from the supply voltage to zero; and after the input voltage drops to the reference voltage lower limit, in response to the input voltage rising to the reference voltage upper limit, the first output voltage changes from the supply voltage to zero, and the second output voltage changes from zero to the supply voltage.

6. The voltage comparison circuit as claimed in claim 5, wherein when the input voltage is greater than or equal to the reference voltage upper limit, in response to the input voltage rising, the first output voltage remains zero, and the second output voltage remains equal to the supply voltage.

7. The voltage comparison circuit as claimed in claim 1, wherein:

when the input voltage is less than the reference voltage lower limit, in response to the input voltage rising to the reference voltage upper limit, the first output voltage changes from the supply voltage to zero, and the second output voltage changes from zero to the supply voltage; and after the input voltage rises to the reference voltage upper limit, in response to the input voltage dropping to the reference voltage lower limit, the first output voltage changes from zero to the supply voltage, and the second output voltage changes from the supply voltage to zero.

8. The voltage comparison circuit as claimed in claim 7, wherein when the input voltage is less than the reference voltage lower limit, in response to the input voltage decreasing, the first output voltage remains equal to the supply voltage, and the second output voltage remains zero.

9. The voltage comparison circuit as claimed in claim 4, wherein the first transistor and the second transistor are N-type metal-oxide semiconductor transistors (NMOS).

10. A current detection system, comprising:

the voltage comparison circuit as claimed in claim 1;

a detection resistor;

a current detection circuit, configured to detect an input current through the detection resistor and convert the input current into the input voltage to be output to the voltage comparison circuit;

a first system circuit, configured to receive the first output voltage; and a second system circuit, configured to receive the second output voltage, wherein when the first output voltage is equal to zero and the second output voltage is equal to the supply voltage, the first system circuit and the second system circuit perform a down-frequency operation, causing the input current to decrease; and when the first output voltage is equal to the supply voltage and the second output voltage is equal to zero, the first system circuit and the second system circuit perform an up-frequency operation, causing the input current to increase.

* * * * *